US012562721B2

(12) United States Patent
Tonge et al.

(10) Patent No.: US 12,562,721 B2
(45) Date of Patent: Feb. 24, 2026

(54) CONTROLLING SLEW RATE

(71) Applicant: Cirrus Logic International Semiconductor Ltd., Edinburgh (GB)

(72) Inventors: Peter J. Tonge, Newbury (GB); John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 240 days.

(21) Appl. No.: 17/939,245

(22) Filed: Sep. 7, 2022

(65) Prior Publication Data

US 2023/0155581 A1      May 18, 2023

Related U.S. Application Data

(60) Provisional application No. 63/280,322, filed on Nov. 17, 2021.

(30) Foreign Application Priority Data

Dec. 14, 2021    (GB) ..................................... 2118054

(51) Int. Cl.
| | |
|---|---|
| *H03K 5/04* | (2006.01) |
| *G10L 19/04* | (2013.01) |
| *H03H 17/02* | (2006.01) |
| *H04R 3/00* | (2006.01) |

(52) U.S. Cl.
CPC ................ *H03K 5/04* (2013.01); *G10L 19/04* (2013.01); *H03H 17/0255* (2013.01); *H04R 3/00* (2013.01)

(58) Field of Classification Search
CPC ..... G01R 31/31924; H03F 2203/45366; H03F 3/45475; H03F 3/45511; H03F 3/505; H03F 1/086; H03F 1/26; H03F 1/3211; H03F 2200/36; H03F 2200/372; H03F 2203/30048; H03F 2203/45258; H03F 2203/45392; H03F 2203/45471;
(Continued)

(56) References Cited

U.S. PATENT DOCUMENTS

| | | | | |
|---|---|---|---|---|
| 4,704,642 A | * | 11/1987 | Namiki .................. | G11B 20/24 |
| 5,317,281 A | * | 5/1994 | Vinn ..................... | H03F 3/3076 |
| | | | | 330/265 |
| 2009/0131099 A1 | * | 5/2009 | Miyashita ........... | H03F 3/45183 |
| | | | | 330/261 |
| 2015/0153735 A1 | * | 6/2015 | Clarke ................... | G01C 11/04 |
| | | | | 701/301 |

(Continued)

FOREIGN PATENT DOCUMENTS

CN            214279558 U        9/2021

OTHER PUBLICATIONS

Combined Search and Examination Report under Sections 17 and 18(3), UKIPO, Application No. GB2118054.2, mailed May 27, 2022.

(Continued)

*Primary Examiner* — Lun-See Lao
(74) *Attorney, Agent, or Firm* — Jackson Walker L.L.P.

(57) ABSTRACT

This application relates to methods and apparatus for controlling slew-rate of components for outputting an analogue output signal. Described is a signal processing circuit having a forward signal path for receiving an input signal and outputting an analogue output signal. The signal processing circuit has a first component located in said forward signal path for outputting the analogue output signal. A predictor is configured to predict a required slew-rate for the first component based on the input signal and a controller is configured to controllably vary an output slew-rate limit of the first component based on the prediction of required slew-rate.

20 Claims, 4 Drawing Sheets

(58) Field of Classification Search
  CPC . H03F 2203/45656; H03F 2203/45674; H03F
      3/04; H03F 3/3001; H03F 3/3066; H03F
        3/45; H03F 3/45089; H03F 3/45094;
      H03F 3/45112; H03F 3/45116; H03F
      3/45125; H03F 3/45183; H03F 3/4521;
        H03F 3/45224; H03F 3/45484; H03F
      3/4556; G10L 19/04; H03G 3/30; H03H
      17/0255; H04R 2227/005; H04R 2499/13;
              H04R 3/00; H04R 3/12
  USPC ................................................. 381/101, 120
  See application file for complete search history.

(56)              References Cited

U.S. PATENT DOCUMENTS

2015/0332695 A1 * 11/2015 Doehla ................. G10L 19/087
                                            704/219
2016/0197588 A1 * 7/2016 Olson ................... H03F 1/0227
                                            381/120
2019/0190471 A1   6/2019 Snoeij et al.
2020/0389165 A1  12/2020 Sul et al.
2022/0230076 A1 * 7/2022 Okawa ................. A61B 5/7267

OTHER PUBLICATIONS

Definition of "predict", Merriam-Webster online dictionary, https://
www.merriam-webster.com/dictionary/predict, retrieved Oct. 16,
2024.

* cited by examiner

CONTROLLING SLEW RATE

FIELD OF DISCLOSURE

The field of representative embodiments of this disclosure relates to methods, apparatus and/or implementations concerning or relating to controlling slew rate of components for producing an analogue signal, for example digital-to-analogue converters (DACs) or amplifiers or the like.

BACKGROUND

Many electronic devices comprise some audio processing circuitry which includes an audio signal processing path configured to provide an analogue audio output, for example to drive an audio output transducer such as a loudspeaker. Such an audio signal processing path may, in some cases, comprise a digital-to-analogue converter (DAC) for receiving a digital input audio signal and outputting a corresponding analogue audio signal and/or at least one linear amplifier stage for providing an amplified analogue output.

In such applications, the performance requirements for the audio signal, e.g. in terms of distortion performance across an operating frequency range and/or peak-to-peak voltage swing etc. may dictate certain operating parameters for the components of the audio signal processing path. For instance, a component of the audio signal processing path that provides an analogue output may be configured such that the rate of change of the output, e.g. the slew-rate of the output voltage, can be sufficiently high to provide the required maximum rate of change for the audio signal without significant distortion.

For at least some components, for instance for an op-amp based amplifier, the maximum rate of change of the output voltage may be limited by the current available, e.g. to charge an effective load capacitance of an output stage. Providing a sufficient current may, in some instances, require the relevant component to receive a relatively high bias current, which can be disadvantageous in terms of power dissipation. Additionally or alternatively, techniques such as feeding back a portion of the output current to an input stage could be implemented, but this could impact on stability due to positive feedback and could increase sensitivity to the output load.

SUMMARY

Embodiments of the present disclosure relate to methods and apparatus for controlling a component that outputs an analogue signal so as to provide an appropriate slew rate which at least mitigate at least some of the above-mentioned issues.

According to an aspect of the disclosure there is provided a signal processing circuit having a forward signal path for receiving an input signal and outputting an analogue output signal, the signal processing circuit comprising: a first component located in said forward signal path for outputting said analogue output signal; a predictor configured to predict a required slew-rate for the first component based on the input signal; and a controller for controllably varying an output slew-rate limit of said first component based on said prediction of required slew-rate.

In some examples the predictor may comprise a linear predictor. The predictor may be configured to determine an indication of amplitude of the input signal and to predict the required slew-rate for the first component based on said indication of amplitude of the input signal. The predictor comprises an envelope detector configured to receive a signal derived from the input signal and determine the indication of amplitude of the input signal. The envelope detector may be configured to operate with an attack time constant which is faster than a release time constant. The predictor may be configured to predict the required slew-rate for the first component based on the indication of amplitude of the input signal and at least one derivative of amplitude of the input signal. In some examples the predictor may comprise a linear predictive coding filter. In some examples the predictor may be further configured to predict the required slew-rate for the first component based on an indication of spectral tilt of the input signal.

In some examples the predictor may comprise a statistical and/or learned predictive filter. The predictive filter may comprise a learned model operable with predetermined model parameters.

The predictor may be configured to predict the required slew-rate for the first component with a look-ahead in time which is at least equal to an implementation time required for the controller to implement a change in the slew-rate limit of the first component.

In some examples, the controller may be configured to controllably vary an output slew-rate limit of said first component by controllably varying a bias current supplied to the first component. Additionally or alternatively, in some examples, the controller may be configured to controllably vary an output slew-rate limit of the first component by controllably reconfiguring the first component. The first component may be a linear amplifier having a plurality of input transconductance stages and an output stage, and the controller may be configured to controllably vary an output slew-rate limit by selectively controlling the number of input transconductance stages enabled in parallel to drive the output stage. The first component may be a linear amplifier having an input transconductance stage, an output stage amplifier and a first compensation capacitor connected across the output stage amplifier, wherein the linear amplifier further comprises at least one additional capacitor that can be selectively coupled in parallel with the first compensation capacitor or disconnected from the first compensation capacitor on an input side of the output stage amplifier and connected to be driven by a buffer. The controller may be configured to controllably vary an output slew-rate limit by selectively controlling the connection of the additional capacitor.

In some examples the first component may be a digital-to-analogue converter.

In some implementations, the forward signal path may further comprise at least a second component for providing an analogue output and the controller may be further configured to controllably vary an output slew-rate limit of said second component based on said prediction of required slew-rate.

In some examples the forward signal path may be a path for outputting an analogue audio signal.

Aspects also relate to electronic device comprising the signal processing circuit of any of the embodiments described herein.

In another aspect there is provided a signal processing circuit having a forward signal path for receiving an input signal and outputting an analogue output signal, the signal processing circuit comprising: a first component located in said forward signal path for outputting said analogue output signal; a predictor configured to predict a parameter of the input signal related to the slew-rate of the input signal; and a controller for controlling an output slew-rate limit of said first component based on said prediction of said parameter of the input signal.

In a further aspect there is provided an audio processing circuit for receiving an input audio signal and outputting an analogue audio output signal, the audio processing circuit comprising: a first component for outputting said analogue audio output signal; a predictor configured to predict a slew-rate value based on the input audio signal; and a controller for controlling an output slew-rate limit of said first component based on said predicted slew-rate value.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
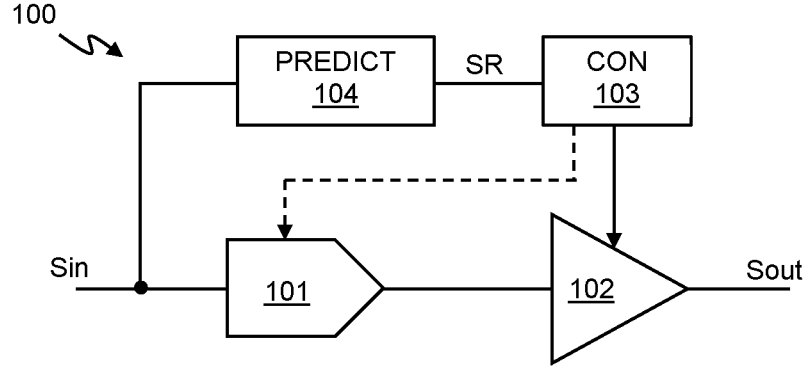
FIG. 1 illustrates one example of a signal processing circuit with dynamic control of an output slew-rate.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above, performance requirements for a signal path for providing an analogue output signal, such as a signal processing path for providing an analogue audio output, can impose corresponding requirements on the components used to generate the analogue output signal. In particular, the performance requirements may require the components to be operable to provide a slew-rate for the analogue output signal up to some defined limit. For instance, if the desired analogue output signal, Sout, were a sine wave of frequency f and amplitude A, i.e. Sout=A·sin $(2\pi \cdot f \cdot t)$, then, as will be understood by one skilled in the art, the greatest instantaneous rate of change of the output signal would be equal to $2\pi \cdot f \cdot A$. The relevant components of the signal path would thus need to be operable to enable a slew-rate for the analogue output signal which is at least as high as this value to avoid introducing slew-rate distortion. Generally, a maximum required slew-rate, SRmax, may be defined based on the maximum rate of change of the analogue output signal required to provide the desired performance, for instance the maximum required slew-rate may be defined so as to be meet the required rate of change of the signal for an analogue output signal at a maximum amplitude, Amax, and an upper frequency limit, fmax, of a frequency band of interest.

The relevant components of the signal path for providing the analogue output signal, e.g. a digital-to-analogue converter (DAC) and/or linear amplifier or the like, may therefore be configured to operate with a slew-rate limit which is at least equal to this maximum required slew-rate, SRmax. However, for at least some components for providing an analogue output, such as DACs or linear amplifiers, the slew-rate limit may generally be related to the power consumption of the component and providing a higher slew-rate limit generally results in a greater power consumption. In general, there is a desire for power efficiency, especially for battery powered devices, and it is generally desirable to reduce power consumption when possible.

In embodiments of the present disclosure, a slew-rate limit of a component for outputting an analogue output signal, such as an amplifier, may be dynamically controlled in use. The slew-rate limit, i.e. the upper limit of what slew-rate can be achieved by that component, may be controllably varied based on a determined slew-rate required for the output signal, so as to allow the slew-rate limit, and hence power consumption, to be reduced when possible. Thus, a maximum slew-rate limit may be enabled when required for the output signal, but at other times, when such a high slew-rate is not required, the slew-rate limit may be reduced, allowing power savings. The slew-rate limit required may be determined from the input signal.

FIG. 1 illustrates one example of a signal processing circuit for outputting an analogue output signal with dynamic control of an output slew-rate limit according to an embodiment. FIG. 1 illustrates that, in this example, the signal processing circuit 100 has a forward signal path comprising a digital-to-analogue converter (DAC) 101 and an amplifier 102 which is configured to receive an input signal Sin, which in this case is a digital input signal that is converted to analogue by DAC 101 and then amplified by amplifier 102, to provide the analogue output signal Sout.

A controller 103 is arranged to dynamically control the slew-rate limit of the amplifier 102, and in some cases also possibly the slew-rate of the DAC 101, in response to an indication of the required slew-rate SR based on the input signal Sin. The controller 103 thus receives the indication, SR, of the required slew-rate and controls the amplifier 102 to implement an appropriate slew-rate limit. The controller 103 may thus control the amplifier to adopt one of a plurality of different possible slew-rate limits and/or to vary the slew-rate limit within an operating range of slew-rate limits. For example, if the required slew-rate SR is a first value (within the operating range) the controller 103 may control the amplifier to provide a first slew-rate limit equal to or greater than the first slew-rate value. If the required slew-rate SR then changes, say increases to a second higher value (within the operating range), the controller 103 controls the amplifier to change the slew-rate limit accordingly, e.g. to increase to the slew-rate limit equal to or greater than the second slew-rate value. Thus, the controller 103 is configured to respond to changes in the required slew-rate so as to controllably vary the slew-rate limit of the amplifier 102 (and possibly also DAC 101).

There are a variety of ways in which the slew-rate limit of a component, such as a DAC or amplifier, may be controllably varied in use. For example, the slew-rate limit may depend on the value of a bias current supplied to the relevant component and the bias current could be controllably varied, so as to reduce the bias current when a lower slew-rate limit is appropriate, to reduce power consumption. Additionally or alternatively, an amplifier could be reconfigured, e.g. to enable or disable some amplifier circuitry, so as to vary the slew-rate limit. Further details of examples of how the slew-rate limit may be controlled will be discussed below.

In general, however, there will be some implementation delay between a change in the required slew-rate SR (that results in a new slew-rate limit being appropriate) and the amplifier 102 actually being operable at that new slew-rate limit. Such implementation delay may include, for example, time for the controller 103 to determine that the slew-rate limit should be changed, time to adjust some parameter for the amplifier to implement the new slew-rate limit, e.g. to change a bias current and/or to enable or disable some circuitry, and possibly some settling or transition time for the changed parameters to become fully effective for the amplifier to be able to operate at the new slew-rate limit.

Because of this implementation delay, the indication SR of the required slew-rate should be a look-ahead indication of what the required slew-rate will be for the output signal Sout at a point in the future, with a sufficient degree of look-ahead to allow time for a change in slew-rate limit to be effectively implemented by the time that the new slew-rate limit is actually required. Without such a look-ahead, if the indication of the required slew-rate SR were to change, such that a new slew rate limit was appropriate, the controller 103 would not have time to effectively implement the change in slew-rate limit of the amplifier before outputting the analogue output signal with the new slew-rate requirement. Were the change in the slew-rate limit to be a decrease in the slew-rate limit, this would mean that the amplifier 102 would continue to operate with a higher slew-rate limit than necessary for some time until the new slew-rate limit was effectively implemented. Such operation would not substantially impact distortion performance but may lead to some slight unnecessary power wastage. However, were the change in the slew-rate limit to be an increase in the slew-rate limit, this would mean that the amplifier 102 would continue to operate with a lower slew-rate limit than necessary for some time until the new slew-rate limit was effectively implemented, which could potentially mean that the slew-rate of the amplifier is insufficient for the required output signal Sout, which could lead to distortion.

In some cases, at least some degree of look-ahead could be provided by determining the required slew-rate SR from the input signal Sin from upstream of some processing delay in the forward signal path. For instance, FIG. 1 illustrates that the input signal Sin is tapped from the forward signal path upstream of the DAC 101 and processed to determine the indication of required slew-rate SR. If the forward signal path included at least one delay element (not illustrated) downstream of the point from which the input signal is tapped, then if the delay provided by the at least one delay element were sufficient, there could be time to determine the required slew-rate SR and for the controller 103 to implement any changes in slew-rate, before the delayed signal in the forward signal path reached the amplifier 102. In some implementations, at least one delay element may be a processing element that provides some other processing function, but which also provides some processing delay, for example there may be an interpolation filter in a digital part of the forward signal path upstream of the DAC which, in operation provides some processing delay. However, in many applications there may not be a sufficient propagation delay in the forward signal path without introducing some additional extra delay, which would add the overall latency of the forward signal path. In general, increasing the latency of the main signal path by adding some additional delay may be undesirable, especially for some applications, such as for ambient noise cancellation or the like, where a low latency is important.

Therefore, in at least some embodiments of the present disclosure, the indication of the required slew-rate SR, is a prediction of the slew-rate that will be required, with a sufficient look-ahead in the prediction to allow for the implementation delay in effectively changing the slew-rate limit. FIG. 1 thus illustrates that a predictor 104 is configured to receive a version of the input signal tapped from the forward signal path and to predict the required slew-rate SR. The controller 103 is thus responsive to the predicted required slew-rate SR to appropriately control the slew-rate of the amplifier 102.

The predictor 104 may comprise a prediction filter and could, for example, comprise a linear predictor or a statistical or learned filter.

Figure 2:
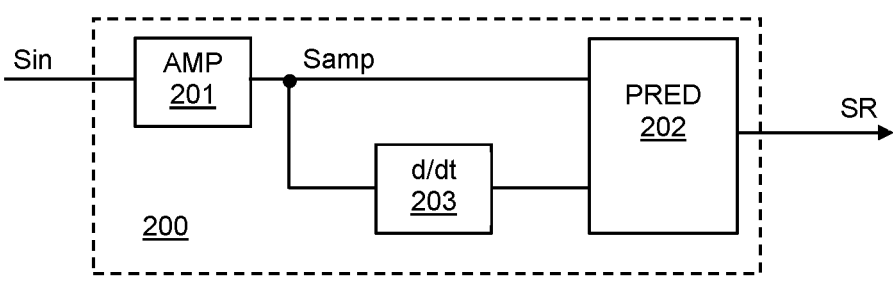
FIG. 2 illustrates one example of a linear prediction filter.

FIG. 2 illustrates one example of a possible predictive filter 200, in this case a linear predictor, which could be used to implement the predictor 104 of FIG. 1. The predictive filter 200 in this example comprises an amplitude determination block 201 for receiving the version of the input signal Sin and determining an indication, Samp, of the amplitude of the input signal. In some implementations the amplitude determination block 201 may be arranged to determine a value of the instantaneous amplitude of the input signal as will be understood by one skilled in the art, although in some implementations the amplitude determination block may comprise an envelope detector as will be discussed in more detail below.

The indication of the amplitude, Samp, is supplied to a predictor block 202, which uses the present value and at least one derivative of the amplitude to determine a prediction of the amplitude at a time in the future. The indication of the amplitude, Samp, may thus also be supplied to a derivative block that determines the derivative of the amplitude value, i.e. the difference between the present value and that of a previous sample. The predictor block 202 may use the current sample value and the at least one derivative value to predict a value for the amplitude at a time Δt in the future, where Δt is sufficient to allow the controller 103 to effectively implement any appropriate change in slew-rate limit, taking the implementation time into account. The predicted amplitude Apred may, for instance, be determined as:

$$\text{Apred} = \text{Samp} + \Delta t \cdot d/dt \, \text{Samp} \qquad \text{Eqn. (1)}$$

The required slew-rate SR may then be determined as:

$$\text{SR} = 2\pi \cdot \text{fmax} \cdot G \cdot \text{Apred} = 2\pi \cdot \text{fmax} \cdot G \cdot (\text{Samp} + \Delta t \cdot d/dt \, \text{Samp}) \qquad \text{Eqn. (2)}$$

where fmax is a defined frequency value corresponding to an upper limit of a frequency band of interest and G is a gain factor indicating any gain between the input signal Sin and the relevant analogue signal, e.g. Sout. Note, in some cases the gain factor G may be taken into account by the amplitude determination block 201 when determining the amplitude value, i.e. so that the value of Samp corresponds to the amplitude of the relevant analogue signal, e.g. Sout, that will be produced based on the input signal Sin, in which case the gain factor is not required, i.e. G=1. The required slew-rate SR can then be output to the controller 103 as illustrated in FIG. 1.

It should be understood that the predictor block 202 need not specifically determine Apred as a separate value and may simply determine the required slew-rate directly. Alternatively, as, in this example, the required slew-rate is directly proportional to Apred (and is essentially Apred scaled by a constant), the value Apred, or some other scaled version thereof could instead by output as the indication of the required slew-rate to the controller 103. In this case it will be understood that by predicting Apred the predictor effectively predicts the required slew-rate for the relevant component, i.e. the value Apred is a predicted slew-rate value that corresponds to the slew-rate required. In general, therefore, the predictor is configured to predict a parameter of the input signal related to the slew-rate of the input signal, which can be used to control an output slew-rate limit of a relevant component.

The controller 103 responds to the indication SR of the required slew-rate and controls the slew-rate limit of the amplifier accordingly. The controller 103 could, for example, compare the indication of required slew-rate to one or more defined thresholds so as to controllably vary the slew-rate limit between different slew-rate limit values, or use a look-up table or the like to controllably vary the slew-rate limit based on the indication SR of the required slew-rate. As the indication of the required slew-rate determined by the predictor 104 varies in use, the controller can dynamically adjust the slew-rate limit of the amplifier 102 accordingly to ensure that the amplifier 102 is operable with a sufficient slew-rate so as to be able to reproduce the required output signal Sout without significant slew-rate distortion but to reduce power consumption when a high slew-rate limit is not required. However, in at least some implementations, whilst varying the slew-rate limit in this way can be advantageous, it may be undesirable for the slew-rate limit to be continually changing or for the slew-rate limit to be repeatedly varies in a relatively short period of time, as such operation could potentially introduce unwanted artefacts into the output signal Sout. In at least some implementations, therefore, the signal processing circuit 100 may be configured so as to avoid rapid toggling of the slew-rate limit. For instance, the controller 103 may apply some hysteresis to any thresholds used for determining the appropriate slew-rate limit or to an amount of change in slew-rate limit required before changing the slew-rate limit and/or apply a defined delay before making some changes in the slew-rate limit. In general, though, the controller 103 should respond relatively quickly to any significant increases in the required slew-rate to ensure the amplifier 102 can operate without slew-rate distortion. The controller 103 may thus respond promptly to increases in the required slew-rate and apply any hysteresis or delay to a subsequent decrease in required slew-rate.

It should be noted that such hysteresis and/or delay could additionally or alternatively be implemented as part of the predictor 104. For instance, referring back to FIG. 2, the predictive filter 200 could be implemented to operate with attack and release time constants. The attack time constant may be relatively fast so that the indication of required slew-rate increases quickly, but the release time constant may be slower so that the indication of required slew-rate reduces at a slower rate and/or only after some hold period. Such attack and release time constants could be implemented as part of the predictor block. Alternatively, in some embodiments, the amplitude detection block 201 could be an envelope detector for determining an envelope value for the input signal, where the envelope detector operates with suitable attack and release time constants.

Figure 3:
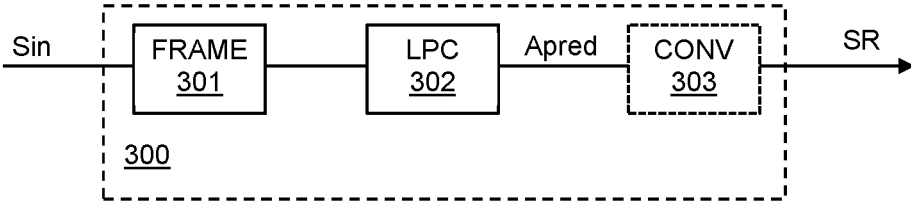
FIG. 3 illustrates another example of a higher order linear prediction filter.

FIG. 2 illustrates a relatively simple linear predictor. More generally a higher order prediction filter could be implemented as the prediction filter, for instance based on a linear predictive coding (LPC) filter such as used for LPC coders. FIG. 3 illustrates an example of a predictive filter 300 that could be implemented as the predictor 104 of FIG. 1. FIG. 3 illustrates that the input signal Sin could be organised into frames and windowed by framer 301 and then input to a LPC filter, as would be understood by one skilled in the art. The LPC filter can output the predicted amplitude Apred which, optionally, may be converted to a required slew-rate by conversion block 303, e.g. based on equation 2 above.

The predictors 200 and 300 discussed with reference in FIGS. 2 and 3 may thus make a prediction of the required slew-rate based, effectively, on a predicted amplitude of the input signal Sin, but in these examples the predictors effectively assume a defined maximum frequency value. The slew-rate limit is thus effectively controlled to ensure that the slew-rate would be sufficient if the frequency content of the input signal were at this upper limit. In practice the frequency content of the input signal could be lower than this upper value and thus the prediction of required slew-rate SR may be higher than is actually necessary.

In some implementations the predictive filters 200 or 300 could take the actual frequency content of the input signal into account, for instance the prediction block 202 of the predictive filter 200 or the calculation block of the predictive filter 300 could additionally receive an indication of the actual frequency content of the input signal and could determine the required slew rate using the actual frequency instead of fmax in equation 2. However, this does require an indication of the frequency content of the input signal to be available.

In some implementations, an indication of the frequency content of the input signal may be determined for some other reason as part of some upstream processing, in which case such an indication of the frequency of the input signal could be taken into account to improve the prediction of the required slew-rate. In many applications, however, such an indication of the frequency content of the input signal may not otherwise be available, and whilst it would be possible for the predictor to determine the frequency content of the input signal, e.g. by using an FFT or the like, the use of an FFT could significantly add to the power consumption and outweigh any gains from the variation in slew-rate limit.

Figure 4:
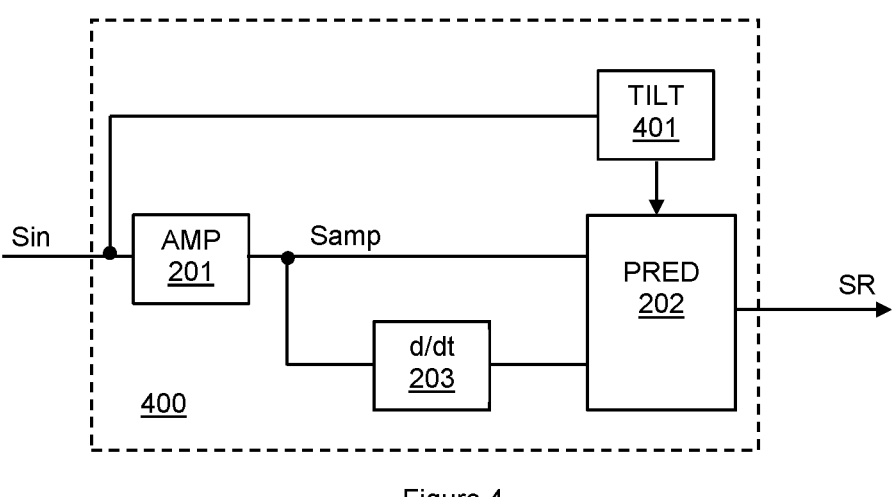
FIG. 4 illustrates a further example of a prediction filter that takes spectral tilt into account.

In some cases, however, an indication of spectral tilt could be taken into account by the predictor. FIG. 4 illustrates an example of a further predictive filter 400 that could be used as the predictor 104 of FIG. 1. In this case the predictive filter 400 comprises a spectral tilt block 401 for determining an indication of spectral tilt for the input signal Sin.

The indication of spectral tilt may be an indication of how the power in the input signal Sin is distributed across the frequency spectrum, e.g. an indication of what the slope or gradient of a power-frequency spectrum would be. The indication of spectral tilt may thus indicate whether the power of the input signal is spread relatively evenly across the frequency band or whether there is significantly greater power at lower frequencies or whether there is significantly greater power at higher frequencies.

The prediction block 202 receives the indication of spectral tilt and takes account of the spectral tilt in determining the indication of the required slew-rate SR. If the spectral tilt indicates that the signal power is greater at higher frequencies, this could indicate that there may be significant signal content up to the high frequency limit and thus the prediction block 202 may use the defined upper frequency value fmax.

However, if the spectral tilt is flat or indicate that the signal power is concentrated at low frequencies, it may be possible to use a lower frequency value without risk of significant distortion and thus the prediction block may use a scaling factor to effectively reduce the value of fmax.

The spectral tilt block 401 may determine spectral tilt in a relatively simple and low power way, e.g. using simple bandpass filters to determine the power in a plurality of defined sub-band across the frequency range. Alternatively spectral tilt could be determined by determining cepstral coefficients as would be understood by one skilled in the art. In some implementation an indication of spectral tilt could be determined by some other circuitry for some other reason and thus the predictive filter 400 could use such indication of spectral tilt.

In some embodiments, the predictor 104 could be implemented as a statistical filter and/or a filter based on machine learning. Such a filter may take the frequency content of the input signal into account when making a prediction.

Figure 5:
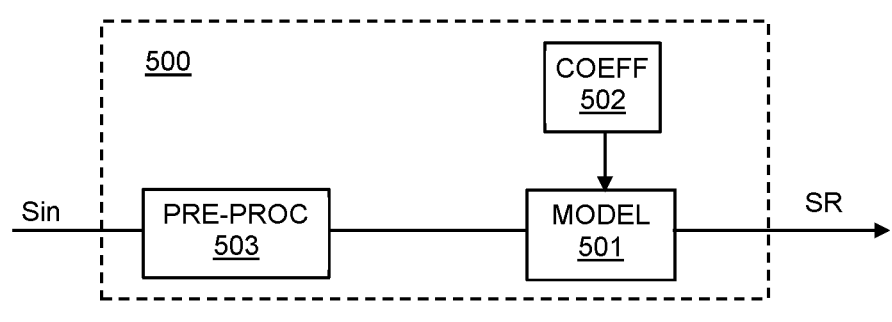
FIG. 5 illustrates an example of a statistical or learned prediction filter.

FIG. 5 illustrates one example of a suitable predictive filter 500 that could be used as the predictor 104 of FIG. 1, which is based on machine learning. FIG. 5 illustrates that the predictive filter may include a model 501 which operates, with suitable model coefficients or model parameters which, in this example are supplied by a coefficient block 502. The model coefficients are predetermined so that the model operates to predict the required slew-rate SR (or some other value related to the required slew-rate that can be used as an indication of required slew-rate) based on the input signal Sin. The model 501 may be any suitable type of model, such as a regression model for predictive modelling as would be understood by one skilled in the art.

In some implementations, the input signal Sin may be supplied directly to the model 501 but, as illustrated in FIG. 5, in some examples, there may be some pre-processing of the input signal Sin to provide suitable inputs for the model, e.g. some serial to parallel conversion or feature extraction.

The model coefficients in this example are predetermined and stored in the coefficient block 502. The model coefficients can be determined in a training process. As will be understood by one skilled in the art the training process may be a centralised training process that is performed for a particular design of signal processing circuit to determine suitable model coefficients for that design. Thus it is not necessary to perform training for each individual circuit as fabricated.

Figure 6:
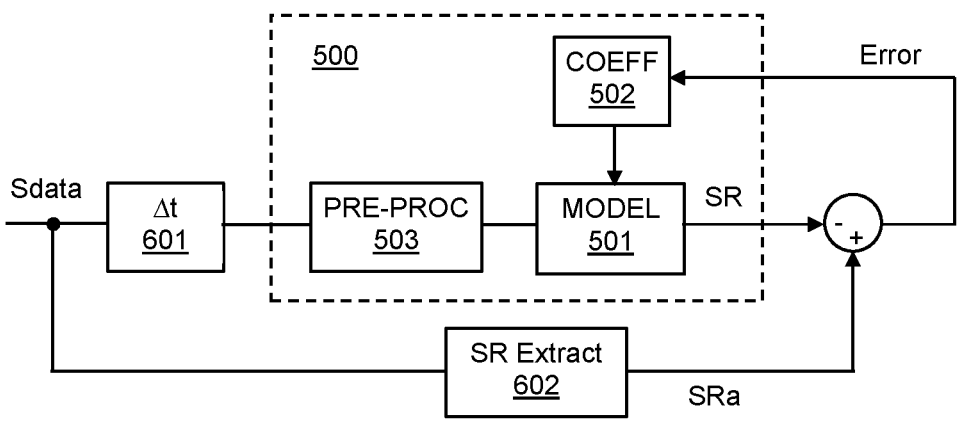
FIG. 6 illustrates an example of how the coefficients for the filter of FIG. 6 could be learned.

FIG. 6 illustrates one example of a suitable training arrangement for determining the coefficients. A version of the predictive filter 500 is arranged to receive input training data Sdata which corresponds to the input signal of interest Sin, e.g. the training data may comprise audio data for audio applications. The training data Sdata is supplied to the predictive filter 500, via a delay 601, and the model 501 operates to determine a prediction of required slew-rate SR based on a current set of coefficients. The undelayed training data Sdata is also supplied to a slew-rate extractor 602 which analyses the training data to determine the actual slew-rate Sra that would be required for that signal content. The slew-rate extractor 602 may, for example, analyse the signal to determine the rate of change thereof and hence the required slew-rate.

The difference between the indication of the required slew-rate SR determined by the model 501 and the actual slew-rate Sra is then determined to provide an error signal which is fed back to the predictive filter 500 to adjust the model coefficients so as to minimise the error. As the predictive filter 500 is operating on the training data Sdata that is delayed by the delay 601, whereas the actual required slew-rate Sra is based on delayed data, the amount of the delay (together with any difference in processing/propagation delays in the two paths) determines the amount of look-ahead in the prediction made by the model 501. This delay may be set to take account of the implementation time required to implement a change in slew-rate in a given design.

The training data Sdata can be selected to include a range of different data corresponding to the likely signals expected in use of the relevant design of signal processing circuit. For instance, for audio applications, the training data may be selected to comprise a variety of different audio, e.g. corresponding to different types of music, video soundtracks, voice communication etc.

In some cases, the signal processing circuit may, in use, be operable in different modes of operation with different types of input signal. In such a case, the coefficient block 502 may be arranged to store a plurality of sets of coefficients to be used in the different modes of operation, with each set of coefficients having been determined using appropriate training data.

Referring back to FIG. 5, the prediction filter 500 is thus operable with at least one set of predetermined model coefficients that were determined using appropriate historic training data. In use, the input signal Sin is thus supplied to the model 501, possibly with some pre-processing, and the model 501 operates, based on the relevant coefficients from the coefficient block 502, to determine the prediction indication of required slew-rate SR. In this case the prediction takes account of the actual signal content of the input signal Sin. The prediction of the required slew-rate SR can be output to the controller 103 which can controllably vary the slew-rate of the relevant component(s) of the forward signal path accordingly.

As noted above, there are various way in which the output slew-rate of a component, such as an amplifier, for outputting an analogue output signal, may be controllably varied. In at least some embodiment the controller 103 may operate to control a bias current supplied to the component.

Figure 7:
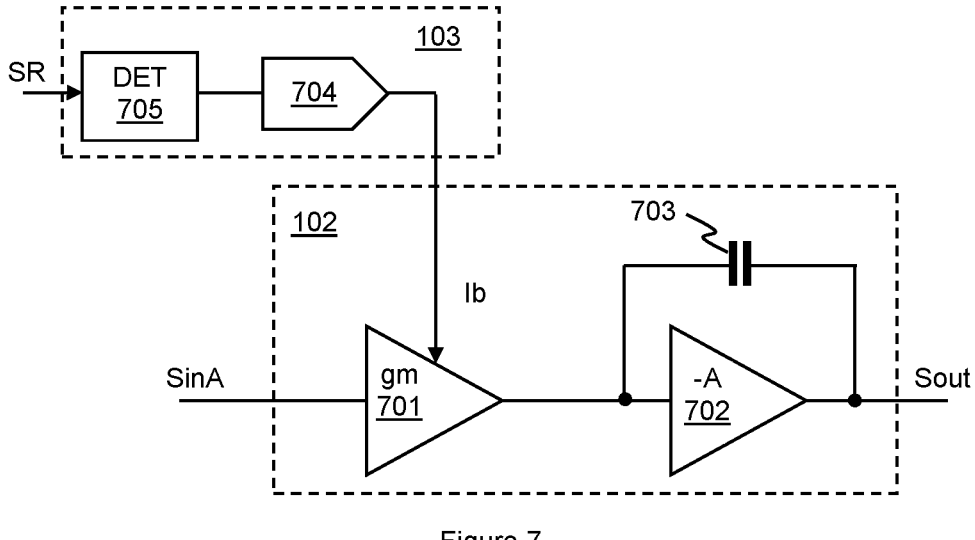
FIG. 7 illustrates an example of how a controller could vary the slew-rate limit of an amplifier.

For instance, FIG. 7 illustrates one example of a linear amplifier that could be used as the amplifier 102 illustrated in FIG. 1. The amplifier 102 receives an analogue input signal SinA and generates an analogue output signal Sout. In this example, as will be understood by one skilled in the art, an input stage transconductance amplifier 701 receives the analogue input signal SinA and drives an output stage, comprising amplifier 702 with compensation capacitor 703, to provide the output signal Sout.

For the amplifier 102 of FIG. 7, the rate of change of the voltage of the output signal Sout depends on the current from the input stage 701 available to charge the output stage capacitance 703. The transconductance gm of the input stage amplifier 701, and hence the maximum amount of current that can be provided, depends, in this example, on a bias current Ib supplied to the input stage amplifier 701. The bias current Ib may conventionally be set to be sufficiently high to allow the desired maximum slew-rate required in use, but as noted above, using a relatively high bias current can, however, result in a relatively high power consumption.

In the example of FIG. 7, the controller 103 is thus configured to controllably vary the bias current Ib supplied to the amplifier, and thus controllably vary the transconductance gm of the input stage amplifier 101. For instance, if the slew-rate required for the output signal is relatively high, the controller 103 may control the bias current Ib to be a first value, sufficient to provide the required slew-rate. However, if the slew-rate required for the output signal was relatively low, the bias current Ib can be controlled to be a second value, lower than the first, which is sufficient to provide the lower slew-rate required, but which provides a reduced power consumption.

The controller 103 may control the bias current Ib in a number of different ways, and may for instance control a variable current source, such as a current DAC 704 as illustrated in FIG. 7, to supply at least part of the bias current Ib. In this example, a determination block 705 receives the indication of required slew-rate SR and determines an appropriate bias current, e.g. via a suitable look-up table or the lie, and controls the current DAC 704 to deliver the appropriate bias current Ib. The determination block 705 may apply some hysteresis or delay to any variation of the bias current as discussed above.

Figure 8:
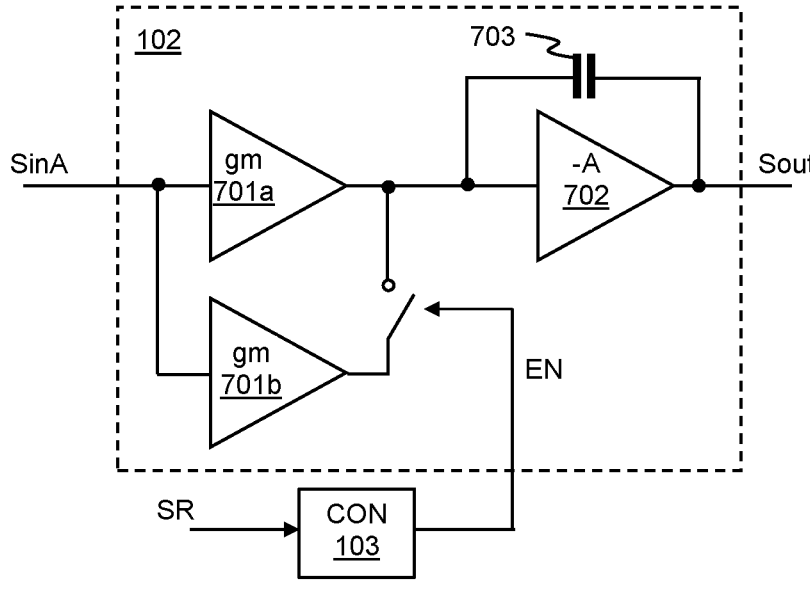
FIG. 8 illustrates an example of how a controller could reconfigure an amplifier to vary the slew-rate limit.

Additionally or alternatively, in some examples the relevant component, e.g. amplifier, may be reconfigured to controllably vary the output slew-rate. For example, FIG. 8 illustrates an example of a linear amplifier suitable for the amplifier 102 of FIG. 1, which is similar to that described with respect to FIG. 7. The amplifier 102 of FIG. 8, however, comprises a plurality of input transconductance amplifiers that can be selectively connected in parallel, in this case amplifier stage 702a and at least one additional amplifier stage 702b. The overall transconductance of the input stage, and thus the current available to charge the output stage capacitance, depends on the number of input amplifier stages selectively enabled and connected in parallel. Thus, if a relatively high slew-rate is required, input amplifier stage 701b can be enabled and connected in parallel with the input amplifier stage 701a to provide a sufficient overall transconductance. However, when the required slew-rate is not so high, and input amplifier stage 701a can provide a sufficient transconductance, the input amplifier stage 701b can be disabled and/disconnected so as to reduce power consumption. The controller 103 is thus configured to control the number of input amplifier stages which are selectively connected and enabled to provide an appropriate slew-rate limit.

Figure 9:
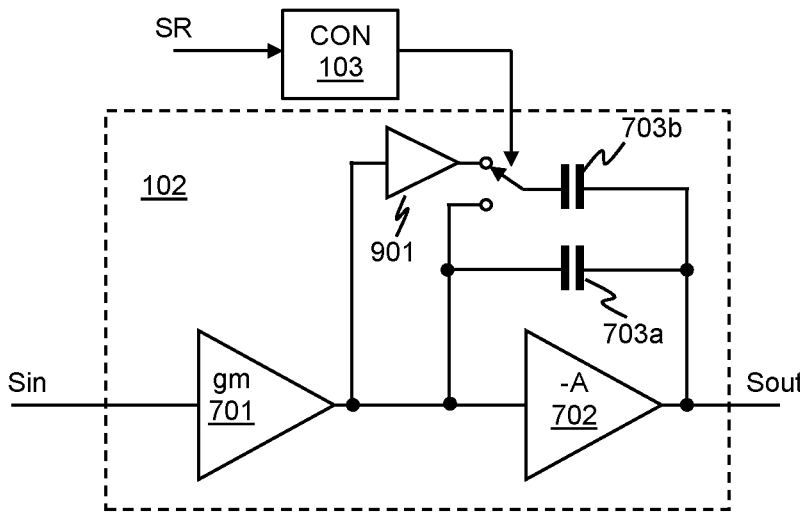
FIG. 9 illustrates a further example of how a controller could reconfigure an amplifier to vary the slew-rate limit.

FIG. 9 illustrates a further example of how the amplifier 102 could additionally or alternatively be reconfigured. FIG. 9 illustrates an example of a linear amplifier suitable for the amplifier 102 of FIG. 1, which is similar to that described with respect to FIGS. 7 and 8, but where the compensation capacitance 703 is provided by two capacitors 703a and 703b. When the required slew-rate is relatively low, the two capacitors 703a and 703b may be connected in parallel and, in use, thus driven by the input stage 701. However, when a higher value of slew-rate limit is required than can be provided by the input stage 701 alone, the capacitor 703b may be switched, on the input side of the output stage amplifier 702, to be driven, i.e. charged, by a high speed buffer 901. This provides additional current to charge the output stage capacitance and thus increases the slew-rate limit. The controller 103 may thus selectively enable the operation of the buffer 901 based on the indication of required slew-rate.

It should be noted that dynamic control of the slew-rate limit of an amplifier by reconfiguring the amplifier such as described with respect to FIGS. 8 and 9 represents novel aspects of the disclosure in their own right and could be implemented in applications which may or may not require prediction of the required slew-rate, e.g. where a propagation delay in the forward signal path provides sufficient look-ahead.

In some implementations the controller 103 may be configured so as to increase the slew-rate limit only during large signal transients so as to avoid or reduce a possibility of loop instability.

In audio applications, where the forward signal path is a path for outputting an analogue audio output signal, the controller 103 may, in some cases, be configured to implement a psycho-acoustic algorithm or similar to determine the best time to make the adjustment in slew-rate limit, so as to minimize the chance of perception of any audible artifacts.

Embodiments of the present disclosure thus relate to dynamic control of the slew-rate of signal processing path for providing an analogue output signal, for example for an audio signal path for outputting an analogue output signal. Dynamically varying the slew-rate limit can provide advantages in terms of power consumption whilst achieving certain distortion performance requirements. Embodiments relate to controllably varying the slew-rate limit of at least one component of such a signal path. The embodiments described above have described varying the slew-rate of a linear amplifier, for instance by controlling a bias current and/or reconfiguring the amplifier, but it will be understood that the principles could additionally or alternatively be applied to additional and/or alternative components of the signal path, for instance a DAC. The slew-rate limit of the component is controlled based on a prediction of the required slew-rate, with the prediction being determined from the input signal, i.e. based on the then-present and historic values of the input signal, the required slew-rate (or at least a parameter related to the slew-rate) is predicted for the signal at a point in the future. Making a prediction of what slew-rate will be required allows the required slew-rate limit to be implemented in good time, but avoids the need for relatively long delays in the forward signal path to allow a sufficient look-ahead. Embodiments of the present disclosure may thus be used with low latency forward signals paths and avoids the need for any otherwise unnecessary delay to be added to the forward signal path. Embodiments thus comprise a predictor for making a prediction regarding the input signal from which an indication of the required slew-rate can be determined. The predictor could be a linear predictor or predictive filter based on a statistical model and/or machine learning.

Embodiments may be implemented as an integrated circuit. Such an integrated circuit may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A signal processing circuit having a forward signal path for receiving an input signal and outputting an analogue output signal, the signal processing circuit comprising:
   a first component located in said forward signal path for outputting said analogue output signal;
   a predictor configured to predict a required slew-rate for the first component based on the input signal, wherein the prediction of the required slew-rate is a prediction of a slew-rate that will be required for the first component to output said analogue output signal based on the input signal at a look-ahead time in the future; and
   a controller for controllably varying an output slew-rate limit of said first component based on said prediction of required slew-rate.

2. The signal processing circuit of claim 1 wherein the predictor comprises a linear predictor.

3. The signal processing circuit of claim 2 wherein the predictor is configured to determine an indication of amplitude of the input signal and to predict the required slew-rate for the first component based on said indication of amplitude of the input signal.

4. The signal processing circuit of claim 3 wherein the predictor comprises an envelope detector configured to receive a signal derived from the input signal and determine said indication of amplitude of the input signal, wherein the envelope detector is configured to operate with an attack time constant which is faster than a release time constant.

5. The signal processing circuit of claim 3 wherein the predictor is configured to predict the required slew-rate for the first component based on said indication of amplitude of the input signal and at least one derivative of amplitude of the input signal.

6. The signal processing circuit of claim 3 wherein the predictor comprises a linear predictive coding filter.

7. The signal processing circuit of claim 3 wherein the predictor is further configured to predict the required slew-rate for the first component based on an indication of spectral tilt of the input signal.

8. The signal processing circuit of claim 1 wherein the predictor comprises a statistical and/or learned predictive filter.

9. The signal processing circuit of claim 8 wherein the predictive filter comprises a learned model operable with predetermined model parameters.

10. The signal processing circuit of claim 1 wherein the predictor is configured to predict the required slew-rate for the first component with a look-ahead in time which is at least equal to an implementation time required for the controller to implement a change in the slew-rate limit of the first component.

11. The signal processing circuit of claim 1 wherein the controller is configured to controllably vary an output slew-rate limit of said first component by controllably varying a bias current supplied to the first component.

12. The signal processing circuit of claim 1 wherein the controller is configured to controllably vary an output slew-rate limit of said first component by controllably reconfiguring the first component.

13. The signal processing circuit of claim 1 wherein the first component is a linear amplifier having a plurality of input transconductance stages and an output stage, and where the controller is configured to controllably vary an output slew-rate limit by selectively controlling the number of input transconductance stages enabled in parallel to drive the output stage.

14. The signal processing circuit of claim 1 wherein the first component is a linear amplifier having an input transconductance stage, an output stage amplifier and a first compensation capacitor connected across the output stage amplifier, wherein the linear amplifier further comprises at least one additional capacitor that can be selectively coupled in parallel with the first compensation capacitor or disconnected from the first compensation capacitor on an input side of the output stage amplifier and connected to be driven by a buffer and the controller is configured to controllably vary an output slew-rate limit by selectively controlling the selective connection of the at least one additional capacitor.

15. The signal processing circuit of claim 1 wherein the first component is a digital-to-analogue converter.

16. The signal processing circuit of claim 1 wherein the forward signal path further comprises at least a second component for providing an analogue output and the controller is further configured to controllably vary an output slew-rate limit of said second component based on said prediction of required slew-rate.

17. The signal processing circuit of claim 1 wherein the forward signal path is a path for outputting an analogue audio signal.

18. An electronic device comprising the signal processing circuit of claim 1.

19. A signal processing circuit having a forward signal path for receiving an input signal and outputting an analogue output signal, the signal processing circuit comprising:

a first component located in said forward signal path for outputting said analogue output signal;

a predictor configured to predict a parameter of the input signal related to the slew-rate of the input signal, wherein the prediction of said parameter of the input signal is a prediction of what said parameter will be in the future after a look-ahead time; and a controller for controlling an output slew-rate limit of said first component based on said prediction of said parameter of the input signal.

20. An audio processing circuit for receiving an input audio signal and outputting an analogue audio output signal, the audio processing circuit comprising:

a first component for outputting said analogue audio output signal;

a predictor configured to predict a slew-rate value based on the input audio signal, wherein said predicted slew-rate value is a prediction of what said slew-rate value will be a time in the future; and a controller for controlling an output slew-rate limit of said first component based on said predicted slew-rate value.

* * * * *